(12) United States Patent
Chadha et al.

(10) Patent No.: US 10,317,459 B2
(45) Date of Patent: Jun. 11, 2019

(54) MULTI-CHIP PACKAGE WITH SELECTION LOGIC AND DEBUG PORTS FOR TESTING INTER-CHIP COMMUNICATIONS

(71) Applicant: NVIDIA Corporation, Santa Clara, CA (US)

(72) Inventors: Ish Chadha, Santa Clara, CA (US); Robert Bloemer, Sterling, MA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 15/582,539

(22) Filed: Apr. 28, 2017

(65) Prior Publication Data
US 2018/0284186 A1 Oct. 4, 2018

Related U.S. Application Data

(60) Provisional application No. 62/481,080, filed on Apr. 3, 2017.

(51) Int. Cl.
*G01R 31/02* (2006.01)
*G01R 31/28* (2006.01)
(Continued)

(52) U.S. Cl.
CPC ........ *G01R 31/2853* (2013.01); *H01L 23/481* (2013.01); *H01L 23/49816* (2013.01);
(Continued)

(58) Field of Classification Search
CPC ...... G01R 31/02; G01R 31/021; G01R 31/28; G01R 31/024; G01R 31/2817;
(Continued)

(56) References Cited

U.S. PATENT DOCUMENTS 5,764,071 A * 6/1998 Chan .................... G01R 1/0408
324/756.02
7,641,481 B2 1/2010 Trobough
(Continued)

OTHER PUBLICATIONS

Danskin et al. "Pascal GPU with NVLINK", https://www.hotchips.org/wp-content/uploads/hc_archives/hc28/HC28.22-Monday-Epub/HC28.22.10-GPU-HPC-Epub/HC28.22.121.Pascal-GPU-DanskinFoley-NVIDIA-v06-6_7.pdf, Aug. 2016, 24 pages.
(Continued)

*Primary Examiner* — Thang X Le
(74) *Attorney, Agent, or Firm* — Artegis Law Group, LLP (57) ABSTRACT

A microelectronic package has an IC chip that includes logical circuitry for routing certain I/O signals to debug ports disposed on an outer surface of the microelectronic package. The I/O signals include data and command signals that are transmitted between semiconductor chips in the microelectronic package via conductive traces that are not physically accessible via with conventional debugging techniques. The logical circuitry may be configured to programmably select I/O signals based on a software input, and may be connected to the various I/O signals transmitted between the IC chip and another IC chip in the microelectronic package when a debugging of the I/O signals is enabled. Circuitry employed in conventional operation of the IC chip may also be employed to connect the logical circuitry to the various I/O signals.

15 Claims, 7 Drawing Sheets

(51) Int. Cl.
  *H01L 25/18* (2006.01)
  *H01L 23/498* (2006.01)
  *H01L 23/48* (2006.01)
  *H01L 23/00* (2006.01)

(52) U.S. Cl.
  CPC ........ *H01L 23/49827* (2013.01); *H01L 24/13* (2013.01); *H01L 24/16* (2013.01); *H01L 24/17* (2013.01); *H01L 25/18* (2013.01); *H01L 2224/13025* (2013.01); *H01L 2224/16146* (2013.01); *H01L 2224/16225* (2013.01); *H01L 2224/17181* (2013.01)

(58) Field of Classification Search
  CPC ............ G01R 31/2849; G01R 31/2884; G01R 31/2886; G01R 31/2896; G01R 31/2851; G01R 31/2853; G01R 31/2801; G01R 31/2889; G01R 31/0433; G01R 31/043; G01R 31/0408; G01R 31/048; G01R 27/02; G01R 1/073
  See application file for complete search history.

(56) References Cited

U.S. PATENT DOCUMENTS

| | | | |
|---|---|---|---|
| 9,106,229 B1 | 8/2015 | Hutton et al. | |
| 9,170,948 B2 | 10/2015 | Loh et al. | |
| 9,817,028 B2* | 11/2017 | Xie | G01R 1/071 |
| 2009/0152547 A1* | 6/2009 | Park | H01L 21/4832 |
| | | | 257/48 |
| 2010/0162037 A1 | 6/2010 | Maule et al. | |
| 2011/0148456 A1* | 6/2011 | Mooyman-Beck | G01R 31/31851 |
| | | | 324/762.02 |
| 2011/0234249 A1* | 9/2011 | Uematsu | G01R 31/2889 |
| | | | 324/754.18 |
| 2012/0106117 A1* | 5/2012 | Sundaram | H01L 23/49827 |
| | | | 361/808 |
| 2012/0242346 A1* | 9/2012 | Wang | G01R 31/318513 |
| | | | 324/537 |
| 2016/0163609 A1 | 6/2016 | Rahman et al. | |
| 2017/0045583 A1 | 2/2017 | Hopkins et al. | |
| 2017/0083475 A1 | 3/2017 | Wu et al. | |
| 2017/0084573 A1 | 3/2017 | Pon et al. | |
| 2017/0336440 A1* | 11/2017 | Garibay | G01R 1/067 |

OTHER PUBLICATIONS

Dasila et al., "High Bandwidth Memory (HBM2) IP Subsystem Solution for 25D HBM ASIC SiPs", https://www.chipestimate.com/tech-talks/2016/11/15/Open-Silicon-High-Bandwidth-Memory-(HBM2)-IP-Subsystem-Solution-for-2.5D-HBM-ASIC-SiPs, Apr. 7, 2017, 4 pages.

Anysilicon, "High Bandwidth Memory—White Paper", http://anysilicon.com/high-bandwidth-memory-white-paper/, Apr. 7, 2017, 8 pages.

Jingee, "HBM Controller IP Holds the Key to Bandwidth", http://www.open-silicon.com/hbm-controller-ip-holds-key-bandwidth/, Jul. 1, 2016, 4 pages.

\* cited by examiner

MULTI-CHIP PACKAGE WITH SELECTION LOGIC AND DEBUG PORTS FOR TESTING INTER-CHIP COMMUNICATIONS

CROSS-REFERENCE TO RELATED APPLICATIONS

This application claims the benefit of United States provisional patent application titled "MULTI-CHIP PACKAGE WITH SELECTION LOGIC AND DEBUG PORTS FOR TESTING INTER-CHIP COMMUNICATIONS," filed on Apr. 3, 2017 and having Ser. No. 62/481,080. The subject matter of this related application is hereby incorporated herein by reference.

BACKGROUND OF THE INVENTION

Field of the Invention

Embodiments of the present invention relate generally to testing of multi-chip integrated circuit packages and, more specifically, to a multi-chip package with selection logic and debug ports for testing inter-chip communication.

Description of the Related Art

In the packaging of integrated circuit (IC) chips, various packaging schemes are employed, including traditional two-dimensional (2D) integrated circuit (IC) packages as well as the more recently introduced 2.5D IC and 3D IC packages. In 2D IC packages, multiple chips are mounted on a printed circuit board, where high-performance logic, lower-performance logic, memory, and analog/RF functions, and other functional elements are presented as discrete devices in separate chip packages. By contrast, in 2.5D ICs and 3D IC packages, multiple IC chips are mounted on a silicon interposer instead of a conventional package substrate. The silicon interposer, which is typically a silicon wafer, allows very small and high-density conductive traces to be formed between the multiple IC chips because the fabrication processes used to form the conductive traces are the same processes used to form the metal interconnects in the metalization layers of a silicon chip.

Compared to 2.5D IC packages and 3D IC packages, a circuit board with individually packaged chips, such as a 2D IC package, has numerous disadvantages. For example, a 2D IC package is generally larger, heavier, consumes more power, and, because the signals propagate relatively slowly across the circuit board from one chip to another, is slower than an equivalent 2.5D or 3D IC package. Furthermore, a 2D IC package has more possible points of failure, given that the soldered joints on the circuit board are more likely to fail than the electrical connections formed within an interposer. That said, troubleshooting a 2D IC package after the different chips have been mounted on the circuit board is relatively straightforward. In particular, the conductive traces carrying I/O signals between the various chips on the circuit board are easily accessible and therefore can be employed to measure specific I/O signals during troubleshooting.

By contrast, troubleshooting a 2.5D or 3D IC package is far more problematic because the I/O signals transmitted between the different chips typically are embedded in the silicon interposer and are not physically accessible. Furthermore, because 2.5D and 3D IC packages are high-bandwidth and are quite dense, typically implementations can include thousands of conductive traces routed between the different chips. One example of such an implementation is a memory bus residing in between a processor and a high-bandwidth memory chip. In such implementations, even if the traces could be physically accessed through the silicon interposer with a probe, the accurate and reliable selection of a specific conductive trace or combination of conductive traces for the purpose of troubleshooting the IC package would be very difficult, if not impossible.

As the foregoing illustrates, what would be useful is a technique for measuring inter-chip communications within a multi-chip package.

SUMMARY OF THE INVENTION

One embodiment of the present invention sets forth a microelectronic package, comprising a plurality of debug ports formed on an outer surface of the microelectronic package, a first semiconductor chip that is coupled to a semiconductor interposer, and a second semiconductor chip that is coupled to the semiconductor interposer. The first semiconductor chip includes a first plurality of electrical contacts, wherein each electrical contact included in the first plurality of electrical contacts is electrically coupled to a respective electrically conductive trace formed within the semiconductor interposer, and logical circuitry that selects a set of electrical contacts from the plurality of electrical contacts and electrically couples each electrical contact in the set of electrical contacts to a respective debug port in the plurality of debug ports. The second semiconductor chip includes a second plurality of electrical contacts, wherein each electrical contact included in the second plurality of electrical contacts is electrically coupled to one of the electrically conductive traces formed within the semiconductor interposer.

At least one advantage of the disclosed embodiments is that I/O signals sent between two semiconductor chips in a multi-chip package can be accessed and employed in troubleshooting the operation of the multi-chip package. A further advantage is that the plurality (e.g., thousands) of conductive traces carrying I/O signals between the two semiconductor chips can be selectively accessed via a manageable number of debug ports.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION OF EXEMPLARY EMBODIMENTS

In the following description, numerous specific details are set forth to provide a more thorough understanding of the present invention. However, it will be apparent to one of skill in the art that the present invention may be practiced without one or more of these specific details.

System Overview

Figure 1:
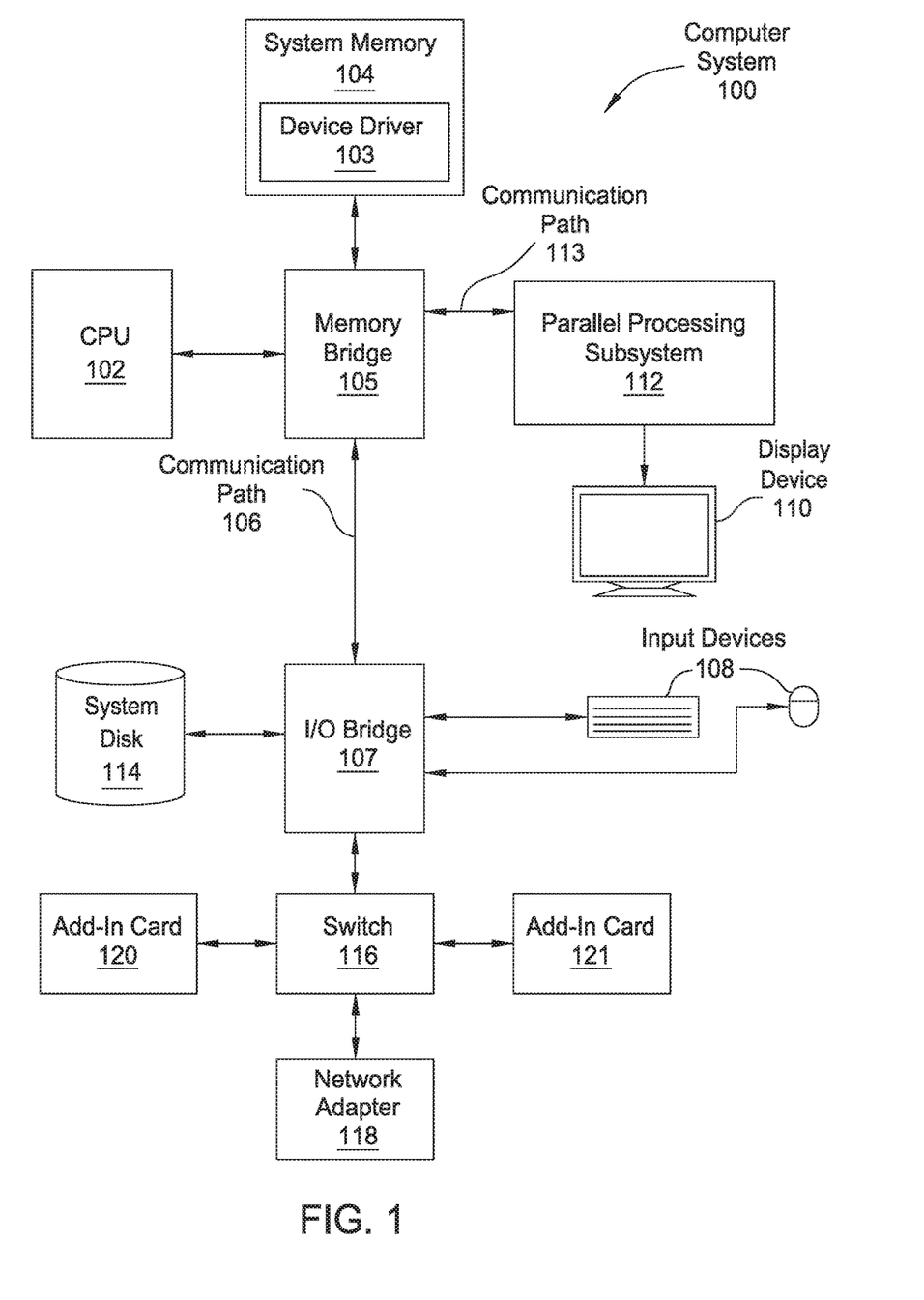
FIG. 1 is a block diagram illustrating a computer system configured to implement one or more aspects of the present invention.

FIG. 1 is a block diagram illustrating a computer system 100 configured to implement one or more aspects of the present invention. As shown, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbrige chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more other the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
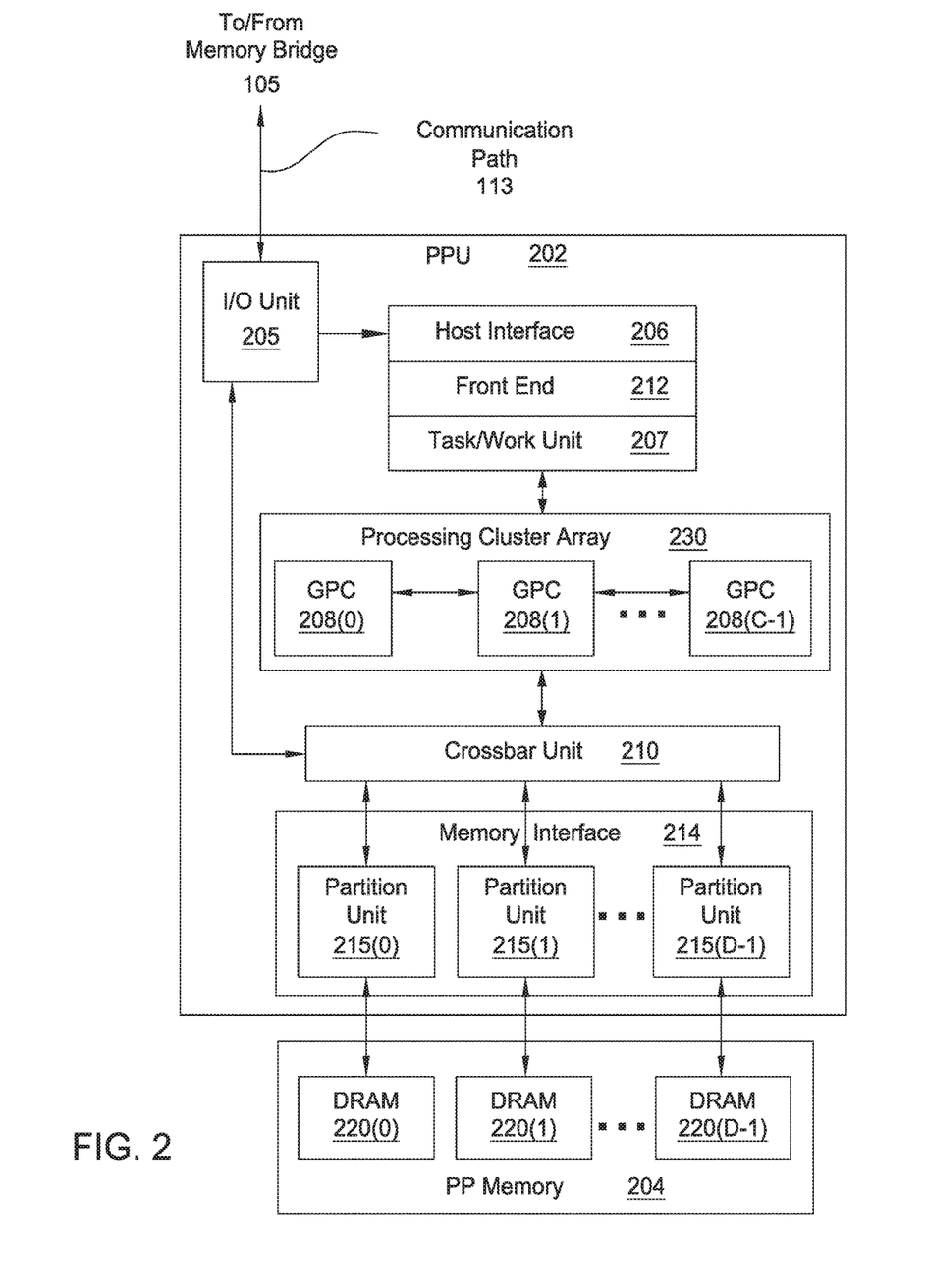
FIG. 2 is a block diagram of a parallel processing unit included in the parallel processing subsystem of FIG. 1, according to one embodiment of the present invention.

FIG. 2 is a block diagram of a parallel processing unit (PPU) 202 included in the parallel processing subsystem 112 of FIG. 1, according to one embodiment of the present invention. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PPU 202 also may be configured for general-purpose processing and compute operations.

In operation, CPU 102 is the master processor of computer system 100, controlling and coordinating operations of other system components. In particular, CPU 102 issues commands that control the operation of PPU 202. In some embodiments, CPU 102 writes a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a pushbuffer to initiate processing of the stream of commands in the data structure. The PPU 202 reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

As also shown, PPU 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system of chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PPU 202 advantageously implements a highly parallel processing architecture based on a processing cluster array 230 that includes a set of C general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where D≥1. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPCs 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

As noted above, any number of PPUs 202 may be included in a parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

Figure 3:
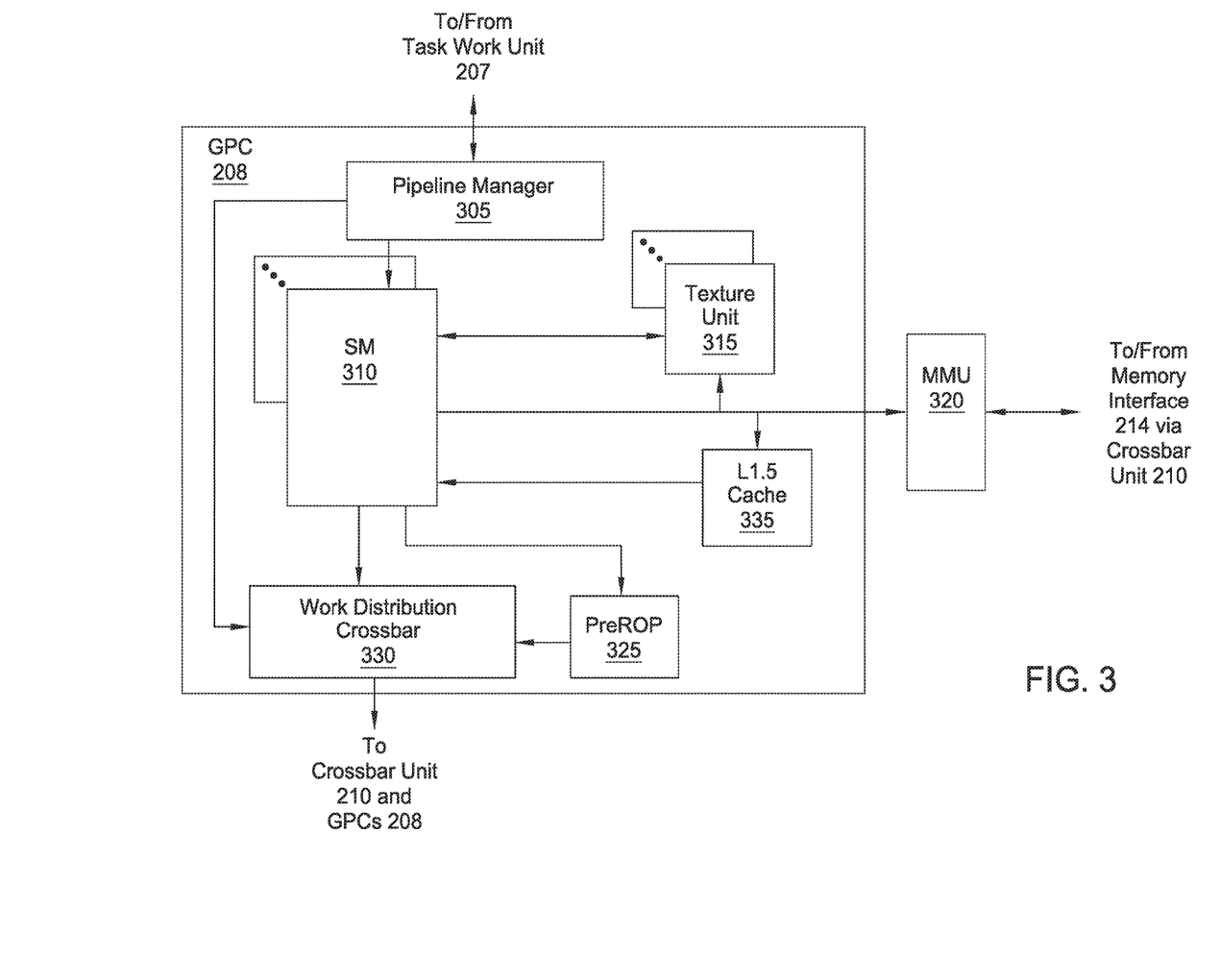
FIG. 3 is a block diagram of a general processing cluster included in the parallel processing unit of FIG. 2, according to one embodiment of the present invention.

FIG. 3 is a block diagram of a GPC 208 included in PPU 202 of FIG. 2, according to one embodiment of the present invention. In operation, GPC 208 may be configured to execute a large number of threads in parallel to perform graphics, general processing and/or compute operations. As used herein, a "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within GPC 208. Unlike a SIMD execution regime, where all processing engines typically execute identical instructions, SIMT execution allows different threads to more readily follow divergent execution paths through a given program. Persons of ordinary skill in the art will understand that a SIMD processing regime represents a functional subset of a SIMT processing regime.

Operation of GPC 208 is controlled via a pipeline manager 305 that distributes processing tasks received from a work distribution unit (not shown) within task/work unit 207 to one or more streaming multiprocessors (SMs) 310. Pipeline manager 305 may also be configured to control a work distribution crossbar 330 by specifying destinations for processed data output by SMs 310.

In one embodiment, GPC 208 includes a set of M of SMs 310, where M≥1. Also, each SM 310 includes a set of functional execution units (not shown), such as execution units and load-store units. Processing operations specific to any of the functional execution units may be pipelined, which enables a new instruction to be issued for execution before a previous instruction has completed execution. Any combination of functional execution units within a given SM 310 may be provided. In various embodiments, the functional execution units may be configured to support a variety of different operations including integer and floating point arithmetic (e.g., addition and multiplication), comparison operations, Boolean operations (AND, OR, XOR), bit-shifting, and computation of various algebraic functions (e.g., planar interpolation and trigonometric, exponential, and logarithmic functions, etc.). Advantageously, the same functional execution unit can be configured to perform different operations.

In operation, each SM 310 is configured to process one or more thread groups. As used herein, a "thread group" or "warp" refers to a group of threads concurrently executing the same program on different input data, with one thread of the group being assigned to a different execution unit within an SM 310. A thread group may include fewer threads than the number of execution units within the SM 310, in which case some of the execution may be idle during cycles when that thread group is being processed. A thread group may also include more threads than the number of execution units within the SM 310, in which case processing may occur over consecutive clock cycles. Since each SM 310 can support up to G thread groups concurrently, it follows that up to G*M thread groups can be executing in GPC 208 at any given time.

Additionally, a plurality of related thread groups may be active (in different phases of execution) at the same time within an SM 310. This collection of thread groups is referred to herein as a "cooperative thread array" ("CTA") or "thread array." The size of a particular CTA is equal to m*k, where k is the number of concurrently executing threads in a thread group, which is typically an integer multiple of the number of execution units within the SM 310, and m is the number of thread groups simultaneously active within the SM 310.

Although not shown in FIG. 3, each SM 310 contains a level one (L1) cache or uses space in a corresponding L1 cache outside of the SM 310 to support, among other things, load and store operations performed by the execution units. Each SM 310 also has access to level two (L2) caches (not shown) that are shared among all GPCs 208 in PPU 202. The L2 caches may be used to transfer data between threads. Finally, SMs 310 also have access to off-chip "global" memory, which may include PP memory 204 and/or system memory 104. It is to be understood that any memory external to PPU 202 may be used as global memory. Additionally, as shown in FIG. 3, a level one-point-five (L1.5) cache 335 may be included within GPC 208 and configured to receive and hold data requested from memory via memory interface 214 by SM 310. Such data may include, without limitation, instructions, uniform data, and constant data. In embodiments having multiple SMs 310 within GPC 208, the SMs 310 may beneficially share common instructions and data cached in L1.5 cache 335.

Each GPC 208 may have an associated memory management unit (MMU) 320 that is configured to map virtual addresses into physical addresses. In various embodiments, MMU 320 may reside either within GPC 208 or within the memory interface 214. The MMU 320 includes a set of page table entries (PTEs) used to map a virtual address to a physical address of a tile or memory page and optionally a cache line index. The MMU 320 may include address translation lookaside buffers (TLB) or caches that may reside within SMs 310, within one or more L1 caches, or within GPC 208.

In graphics and compute applications, GPC 208 may be configured such that each SM 310 is coupled to a texture unit 315 for performing texture mapping operations, such as determining texture sample positions, reading texture data, and filtering texture data.

In operation, each SM 310 transmits a processed task to work distribution crossbar 330 in order to provide the processed task to another GPC 208 for further processing or to store the processed task in an L2 cache (not shown), parallel processing memory 204, or system memory 104 via crossbar unit 210. In addition, a pre-raster operations (preROP) unit 325 is configured to receive data from SM 310, direct data to one or more raster operations (ROP) units within partition units 215, perform optimizations for color blending, organize pixel color data, and perform address translations.

It will be appreciated that the core architecture described herein is illustrative and that variations and modifications are possible. Among other things, any number of processing units, such as SMs 310, texture units 315, or preROP units 325, may be included within GPC 208. Further, as described above in conjunction with FIG. 2, PPU 202 may include any number of GPCs 208 that are configured to be functionally similar to one another so that execution behavior does not depend on which GPC 208 receives a particular processing task. Further, each GPC 208 operates independently of the other GPCs 208 in PPU 202 to execute tasks for one or more application programs. In view of the foregoing, persons of ordinary skill in the art will appreciate that the architecture described in FIGS. 1-3 in no way limits the scope of the present invention.

It will be appreciated that the system shown herein is illustrative and that variations and modifications are possible.

Multi-Chip Package with Selection Logic and Debug Ports

Figure 4A:
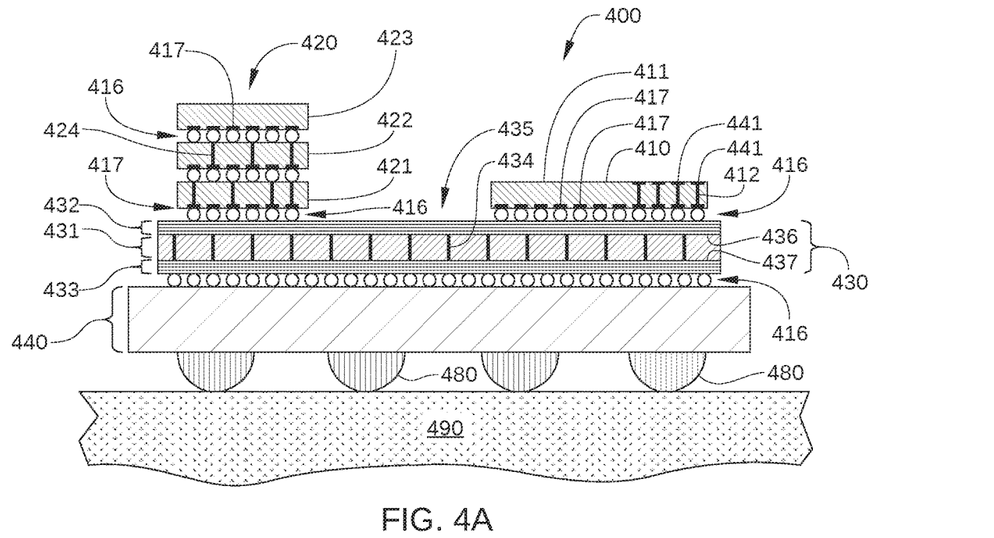
FIG. 4A is a schematic cross-sectional view of a microelectronic package, according to various embodiments of the present invention.
Figure 4B:
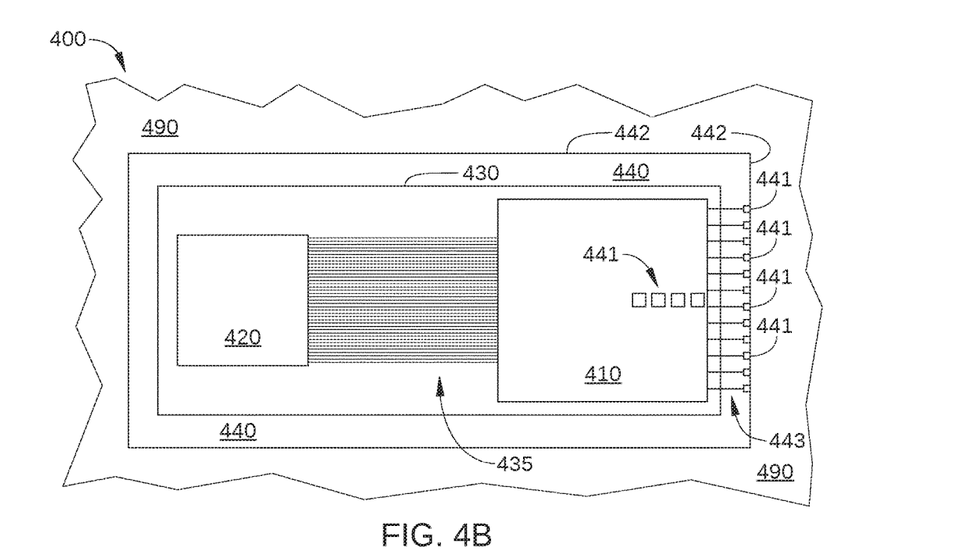
FIG. 4B is a schematic plan view of the microelectronic package of FIG. 4A, according to various embodiments of the present invention.

FIG. 4A is a schematic cross-sectional view of a microelectronic package 400, according to various embodiments of the present invention, and FIG. 4B is a schematic plan view of microelectronic package 400, according to various embodiments of the present invention. Microelectronic package 400 includes integrated circuit (IC) chip 410 and 3D IC chip stack 420 mounted on an interposer 430, and a package substrate 440 coupled to interposer 430. As shown, IC chip stack 420 includes multiple IC chips 421, 422, and 423. For reference, a printed circuit board (PCB) 490, on which microelectronic package 400 may be mounted, is also shown in FIGS. 4A and 4B. Microelectronic package 400 is configured to electrically and mechanically connect the IC chips 410 with 3D IC chip stack 420, as well as and any other logic or memory ICs mounted on interposer 430, to PCB 490 or other mounting substrate external to microelectronic package 400. In addition, microelectronic package 400 protects IC chip 410 and 3D IC chip stack 420 from ambient moisture and other contamination, and minimizes mechanical shock and stress thereon. For clarity, some elements of IC system 400 are omitted from FIG. 4A, such as over-molding that may be used to encapsulate IC chip 410 and/or 3D IC chip stack 420, a heat spreader mounted on IC chip 410 and/or 3D IC chip stack 420, etc.

Each of IC chips 410 and IC chips 421, 422, and 423 is a semiconductor chip. For example, one or more of IC chips 410, 421, 422, or 423 may be a central processing unit (CPU), a graphics processing unit (GPU), an applications processor (APU), a field-programmable gate array (FPGA) chip, or other logic device, such as CPU 102 in FIG. 1 or PPU 202 in FIG. 2. Alternatively or additionally, one or more of IC chips 410, 421, 422, or 423 may be a memory chip, such as memory 104 in FIG. 1 or PP memory 204 in FIG. 2, a global positioning system (GPS) chip, a radio frequency (RF) transceiver chip, a Wi-Fi chip, a system-on-chip, or any semiconductor chip that is suitable for mounting on interposer 430. Thus, IC chips 410 and IC chips 421, 422, and 423 may include any IC chips that may benefit from being assembled together in a single microelectronic package.

IC chip 410 and 3D IC chip stack 420 may be mounted onto interposer substrate 430 using solder microbumps 416 or any other technically feasible approach. Each microbump 416 is typically soldered or otherwise electrically coupled to a respective electrical contact or pad 417 formed on a surface of IC chip 410 or of an IC chip included in 3D IC chip stack 420. An underfill material (not shown) may be used to protect the electrical connections between IC chip 410 and interposer 430 and between 3D IC chip stack 420 and interposer 430. Each microbump 416 is also typically soldered or otherwise electrically coupled to a respective electrical contact or pad (not shown for clarity) disposed on a surface of interposer 430.

In some embodiments, IC chip 410 is a logic chip, such as a CPU or GPU, and IC chips 421-423 are memory chips associated with IC chip 410. In such embodiments, 3D IC chip stack 420 may include identical dynamic random-access memory (DRAM) or other random access memory chips that are each electrically coupled to IC chip 410 via a plurality of conductive traces 435 (described below) formed in interposer 430. For example, in some embodiments, IC chips 422 and 423 of 3D IC chip stack 420 are electrically coupled to interposer 430 and/or to IC chip 421 via a plurality of through-silicon vias 424 that are configured to pass signals vertically through 3D IC chip stack 420. Alternatively or additionally, in some embodiments, IC chips 422 and 423 of 3D IC chip stack 420 are electrically coupled interposer 430 and/or to each other via a plurality of electrically conductive traces (not shown) formed on outer surfaces of IC chips 421-423. In either case, each of IC chips 421-423 can be configured to receive and transmit input/output (I/O) signals directly to and from IC chip 410 via conductive traces 435 in interposer 430. In some embodiments, the base chip of 3D IC chip stack 420, i.e., IC chip 421, is a different chip than a DRAM chip, while the remaining chips of 3D IC chip stack 420 are DRAM chips.

Interposer 430 is configured to form an intermediate layer or structure that provides electrical connections between IC chip 410, 3D IC stack 420, and any other semiconductor chips mounted on interposer 430. In addition, interposer 430 is configured to provide electrical connections between semiconductor chips mounted on interposer 430 and package substrate 440, i.e., with through-silicon vias (TSVs) 434. As such, interposer 430 includes a semiconductor substrate 431, such as a silicon wafer, a metal interconnect layer 432 formed on a chip-facing surface 436 of semiconductor substrate 431, an interconnect layer 433 formed on a substrate-facing surface 436 of semiconductor substrate 431, and TSVs 434. Alternatively, in some embodiments, one or more of IC chips 410, 421, 422, and 423 are electrically connected to interposer 430 and/or package substrate 440 via wire bonding (not shown) instead of or in addition to TSVs 434.

The electrical interconnects of interconnect layer 432, such as conductive traces 435, are configured to electrically couple IC chip 410 and 3D IC stack 420 to each other and to TSVs 434 formed in interposer 430. In addition, conductive traces 435 and TSVs 434 are configured to facilitate high-speed propagation of signals between IC chip 410, 3D IC stack 420, and package substrate 440. interconnect layer 432 and interconnect layer 433 each may include ground, power, and signal connections to each of IC chip 410 and 3D IC stack 420, and interconnect layer 432 includes conductive traces 435 between IC chip 410 and 3D IC stack 420.

The electrical interconnects of interconnect layer 432 can be formed on interposer 430 using various thin-film deposition, patterning, and etching techniques well-known in the art for forming electrical interconnects on semiconductor substrates. Therefore, interposer 430 enables the formation of finely pitched, i.e., closely spaced, conductive traces 435 that can provide the high number of interconnects associated with multi-chip microelectronic packages. For example, the wide-interface architecture of a high-bandwidth DRAM system may have one thousand or more conductive traces 435 for each IC chip in 3D IC chip stack 420. Thus, when 3D IC chip stack 420 includes four such DRAM chips, four thousand or more conductive traces 435 are formed between IC chip 410 and 3D IC chip stack 420, and are necessarily closely spaced, e.g., having a line pitch on the order of 10-100 microns. The formation of such a large number of closely-spaced conductive traces is generally impossible to implement using techniques associated with a conventional package substrate, such as a laminate made from FR4 or polyimide, and having copper tracks and vias.

Package substrate 440 is a rigid and electrically insulating substrate on which interposer 430 is mounted that provides microelectronic package 400 with structural rigidity. In some embodiments, package substrate 440 is a laminate substrate and is composed of a stack of insulative layers or laminates that are built up on the top and bottom surfaces of a core layer. Package substrate 440 also provides an electrical interface for routing input and output signals and power between IC chip 410 and 3D IC chip stack 420 and electrical connections 480. Electrical connections 480 provide electrical connections between microelectronic package 400 and PCB 490 or other mounting substrate external to microelectronic package 400. Electrical connections 480 may be any technically feasible chip package electrical connection known in the art, including a ball-grid array (BGA), a pin-grid array (PGA), and the like.

According to various embodiments, microelectronic package 400 is configured with a plurality of debug ports 441. Debug ports 441 may be any technically feasible port connector (male or female), pad, or other structure configured to enable making a temporary electrical connection with external equipment to IC chip 410. Debug ports are formed on one or more outer surfaces 442 of microelectronic package 400, and are each electrically coupled to muxing logic (not shown) in IC chip 410 via a respective debug trace 443.

In some embodiments, some or all of debug traces 443 are partially or entirely formed on a surface of or within package substrate 440. In such embodiments, some or all of debug ports 441 may be disposed on an exposed surface of package substrate 440. Alternatively or additionally, in some embodiments, portions of debug traces 443 are formed on or within PCB 490. In such embodiments, one or more of debug ports 441 may be respectively disposed on an exposed surface of PCB 490. Alternatively or additionally, in some embodiments, some or all of debug traces 443 are formed partially within IC chip 410. In such embodiments, debug traces 443 may also be partially formed on or within interposer 430 and/or partially formed on a surface of package substrate 440. In other embodiments, some or all of debug traces 443 are formed entirely within IC chip 410. In such embodiments, one or more of debug ports 441 may be respectively configured as a conductive pad formed on an exposed surface 411 of IC chip 410, and debug traces 443 may include TSVs 412 that terminate at exposed surface 411. The physical arrangement of muxing logic in IC chip 410, conductive traces 435, debug traces 443, and debug ports 441 relative to each other is described below in conjunction with FIG. 5.

Figure 5:
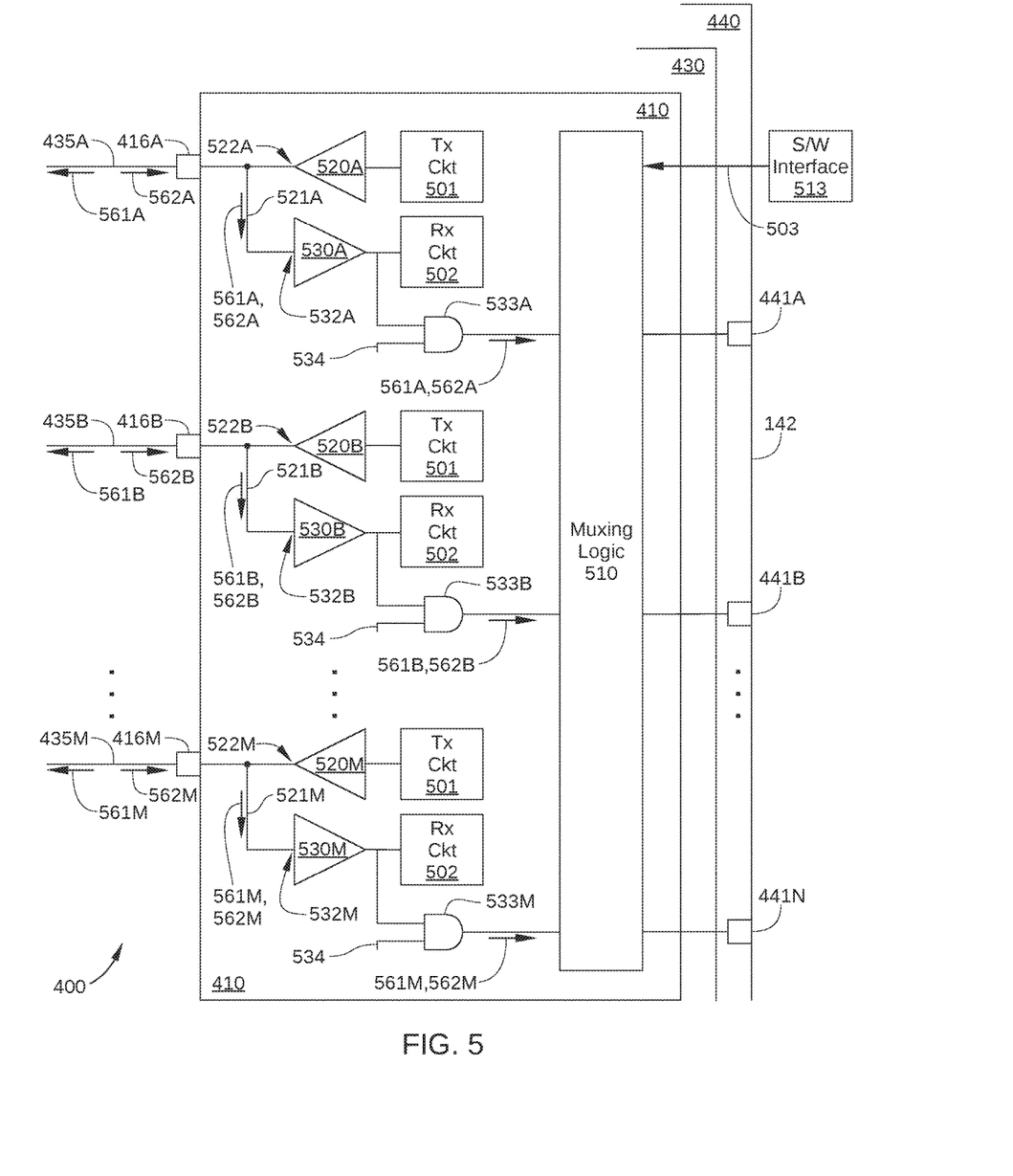
FIG. 5 is a partial schematic view of the integrated circuit (IC) chip of FIGS. 4A and 4B, according to various embodiments of the present invention.

FIG. 5 is a partial schematic view of microelectronic package 400 and IC chip 410, according to various embodiments of the present invention. As shown, microelectronic package 400 includes a plurality of N debug ports 441A-441N disposed on outer surface 442 of microelectronic package 400. N may be any technically feasible number of debug ports that can be formed on microelectronic package 400, for example on the order of 10 to 100. In addition, microelectronic package 400 includes a plurality of M conductive traces 435A-435M configured to connect IC chip 410 to 3D IC chip stack 420 or to any other IC chip mounted on interposer 430. M may be any technically feasible number of I/O signal interconnects that can be formed on microelectronic package 400 within interposer 430, for example on the order of 1,000 to 10,000.

IC chip further 410 includes muxing logic 510 that is coupled to debug ports 441A-441N and is configured to selectively couple certain I/O signals of interest within microelectronic package 400 to a respective debug port 441. Specifically, muxing logic 510 is configured to selectively couple respective debug ports 441 to one or more I/O signals transmitted from IC chip 410 to 3D IC chip stack 420, and/or or one or more I/O signals transmitted from 3D IC chip stack 420 to IC chip 410. Thus, of the M (e.g., thousands) I/O signals transmitted between IC chip 410 to 3D IC chip stack 420, N specific signals can be selected for measurement by muxing logic 510 and respectively coupled to N debug ports 441.

Each of conductive traces 435A-435M that is configured to carry a particular I/O signal from IC chip 410 to 3D IC chip stack 420 (or to any other IC chip mounted on interposer 430) is generally coupled to a memory transmitter in the IC chip 410. Similarly, each conductive trace 435 that is configured to carry a particular I/O signal to IC chip 410 from 3D IC chip stack 420 (or from any other IC chip mounted on interposer 430) is generally coupled to a memory receiver in the IC chip 410. In the embodiment illustrated in FIG. 5, conductive traces 435A-435M are depicted as bidirectional traces, i.e., conductive traces formed on interposer 430 that can send data to 3D IC stack 420 from IC chip 410 and can send data to IC chip 410 from 3D IC stack 420. Thus, conductive trace 435A is electrically coupled, via a microbump 416A, to an output terminal 522A of a memory transmitter 520A, as well as to an input terminal 532A of a host/GPU receiver 530A, conductive trace 435B is electrically coupled, via a microbump 416B, to an output terminal 522B of a memory transmitter 520B, as well as to an input terminal 532B of a host/GPU receiver 530B, and so on. Alternatively, in some embodiments, one or more of conductive traces 435A-435M are configured as unidirectional traces, and are generally coupled to either a memory receiver or to a memory transmitter.

Memory transmitter 520A is configured to receive a signal 561A from transmit circuitry 501 of IC chip 410 and to transmit signal 561A to 3D IC stack 420 via conductive trace 435A. Host/GPU receiver 530A is configured to receive a signal 562A from 3D IC stack 420 via conductive trace 435A and to send signal 562A to receive circuitry 502 of IC chip 410. Signal 561A may include any technically feasible I/O signal transmitted from IC chip 410 to 3D IC stack 420, such as a command signal, a clock signal, a reset signal, a data signal, a signal carrying an Institute of Electrical and Electronics Engineers (IEEE) 1500 standard instruction, and the like. Similarly, signal 562A may include any technically feasible I/O signal transmitted from 3D IC stack 420 to IC chip 410, such as a data signal.

As shown, IC chip 410 includes circuitry to connect signals transmitted via conductive traces 435A-435M to muxing logic 510 when a debug mode of IC chip 410 is enabled. For example, in some embodiments, IC chip 410 may include an AND gate or other controllable logic device for each of conductive traces 435A-435M that is configured to electrically couple whatever signal is transmitted via that conductive trace to muxing logic 510. Thus, in such an embodiment, conductive trace 435A and microbump 416A are electrically coupled to a conductive trace 521A within IC chip 410 that connects an output 522A of memory transmitter 520A to an input 532A of host/GPU receiver 530A. Furthermore, an output 531A of host/GPU receiver 530A is electrically coupled to a selectable logic device 533A, so that a signal leaving host/GPU receiver 530A can be routed to muxing login 510 in addition to receive circuitry 502. Consequently, during a debugging process, i.e., when selectable logic device 533A is enabled via a debug bus enable signal 534, signal 561A is transmitted to muxing logic 510 in addition to 3D IC stack 420, and signal 562A is transmitted to muxing logic 510 in addition to receive circuitry 502. In such embodiments, each of conductive traces 435B-435M is similarly coupled to muxing logic 510 via selectable logic devices 533B-533M.

In some embodiments, debug bus enable signal 534 is triggered, i.e., connected to selectable logic devices 533B-533M, in response to a user selecting one or more values, via a user interface, that indicates one or more specific I/O signals that are carried by conductive traces 435A-435M. Alternatively or additionally, debug bus enable signal 534 is triggered in response to a user-provided input indicating that a debugging mode is enabled.

Muxing logic 510 may include any technically feasible selection or routing logic or other circuitry configured to enable the selection of N specific inputs from signals 561A-561M and/or from signals 562A-562M. In some embodiments, muxing logic 510 is configured to select the N specific inputs in response to receiving a software input 503, thereby enabling a user to discretely select signals carried by up to N of conductive traces 435A-435M. In such embodiments, user-facing software interface 513 typically provides a user interface that enables a user to select specific I/O signals during the trouble-shooting process, such as specific data signals, commands from the processor to the memory chip, a clock or reset signal, and the like. In some embodiments, software interface 513 is executed on CPU 102 in FIG. 1.

In some embodiments, conductive traces 435A-435M are organized into a plurality of channels, for example one or two channels for each IC chip in 3D IC stack 420, where each channel includes multiple data words, e.g., four per channel, and each data word includes multiple bits, e.g., 32 bits per data word. In such embodiments, software input 503 can include a value indicating a particular channel of interest, a value indicating a particular data word of interest, and a value indicating a particular bit of interest. Each such channel-word-bit combination included in software input 503 corresponds to a particular one of conductive traces 435A-435M. Thus, by inputting N such combinations, a user can discretely select N specific signals that are carried by conductive traces 435A-435M.

In some embodiments, one debug port 441 may only be electrically coupled to a specific conductive trace when debug bus enable signal 534 is enabled, so that during a debugging process the specific signal carried by that specific conductive trace is always available for measurement at the same debug port 441. For example, a clock signal, a reset signal, or a particular command signal (such as read, write, etc.), may be routed by muxing logic 510 to the same debug port 411. Alternatively or additionally, in some embodiments, multiple debug ports 441 may be dedicated to a different specific conductive trace when debug bus enable signal 534 is enabled. Consequently, during a debugging process, multiple specific signals are each always available for measurement at the same debug port 441. Alternatively or additionally, in some embodiments, one or more subgroups of debug ports 441A-441N may be selected by a user, via software input 503. One such embodiment is illustrated in FIG. 6.

Figure 6:
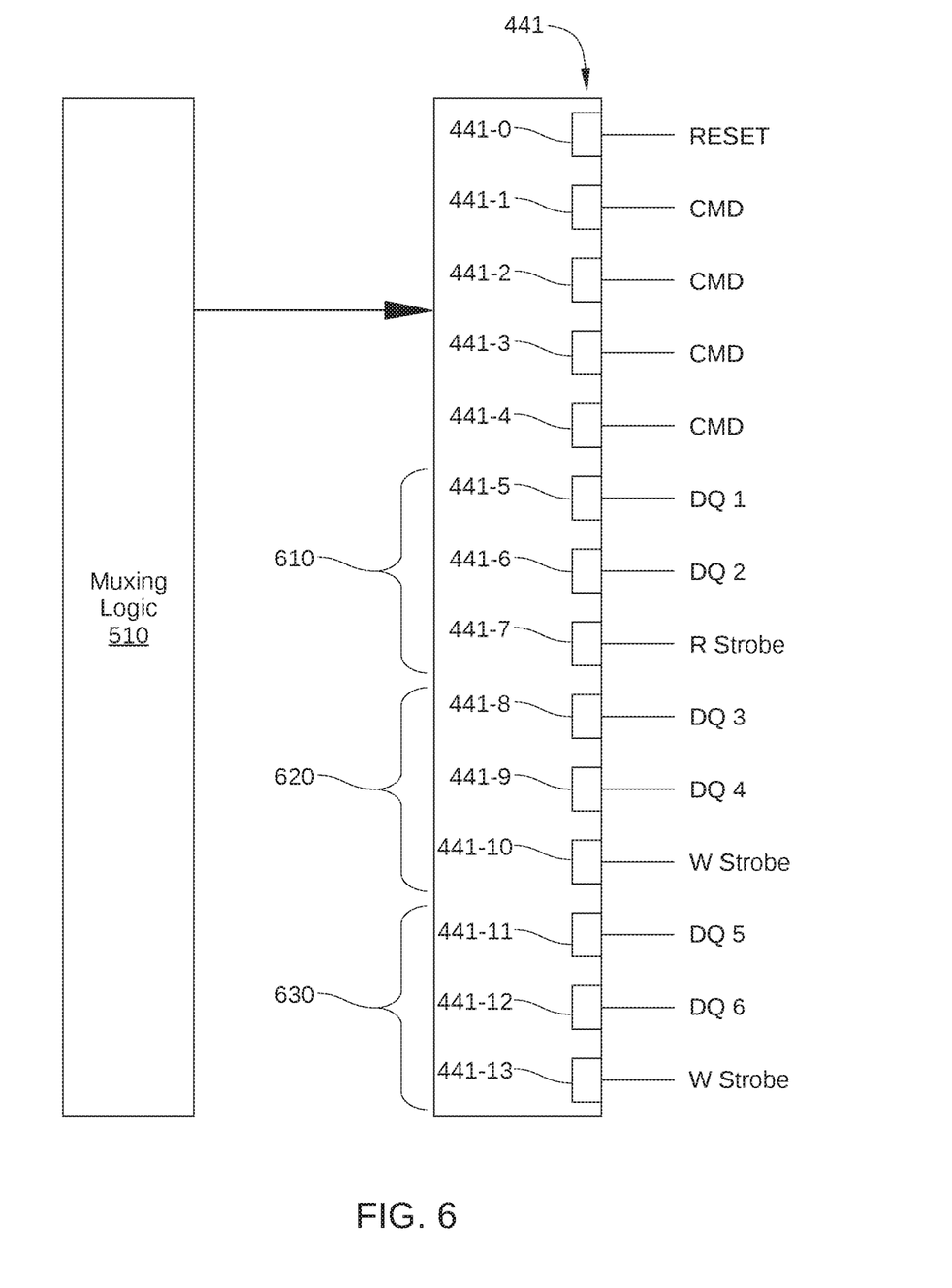
FIG. 6 schematically illustrates debug ports of FIGS. 4A and 4B, according to various embodiments of the invention.

FIG. 6 schematically illustrates debug ports 441A-441N according to various embodiments of the present invention. In the embodiment illustrated in FIG. 6, N=14, so debug ports 441-0 through 441-13 are shown. The below-described configuration of debug ports 441-0 through 441-13 is intended only as an example; any technically feasible configuration of debug ports 441-0 through 441-13 may be employed in different embodiments of the invention.

In the embodiment illustrated in FIG. 6, muxing logic 510 is configured to electrically connect a reset signal to debug port 441-0 whenever debug bus enable signal 534 is enabled. In addition, muxing logic 510 is configured to electrically connect a different command signal (such as read, write, etc.) to each of debug ports 441-1 through 441-4 whenever debug bus enable signal 534 is enabled. In some embodiments, the command signals respectively connected to each of debug ports 441-1 through 441-4 is fixed for all debug sessions, whereas in other embodiments, one or more of the command signals electrically connected to debug ports 441-1 through 441-4 is selectable via software input 503. In some embodiments, the remaining debug ports 441-5 through 441-13 are organized into subgroups 610, 620, and 630.

Each of subgroups 610, 620, and 630 includes multiple debug ports 441. In some embodiments, muxing logic 510 is configured to direct signals to a particular subgroup that are related. For instance, in some embodiments, signals electrically connected to subgroup 610 include read data signals DQ1 and DQ2 and a reference signal related to read data signals DQ1 and DQ2. Thus, read data signal DQ1 is connected to debug port 441-5, read data signal DQ2 is connected to debug port 441-6, and an R Strobe signal is connected to debug port 441-7, as shown. In another example, signals electrically connected to subgroup 620 include write data signals DQ3 and DQ4 and a reference signal related to write data signals DQ3 and DQ4. Thus, write data signal DQ3 is connected to debug port 441-8, write data signal DQ4 is connected to debug port 441-9, and a W Strobe signal is connected to debug port 441-10, as shown.

It is noted that in embodiments in which signals are directed to one or more subgroups of debug ports 441, each signal directed thereto is typically selectable via software input 503. As a result, user-selected signals are generally directed to one or more of subgroups 610, 620, or 630. In such embodiments, software input 503 may include a value indicating a particular subgroup of debug ports to which one or more signals are to be electrically connected by muxing logic 510.

In the embodiments illustrated in FIGS. 4-6, microelectronic package 400 is depicted as a 3D IC package in which multiple IC chips and/or chip stacks are mounted on an interposer. In other embodiments, debug ports 441 and muxing logic 510 are incorporated into other configurations of microelectronic packages where it is not possible to bring out signals directly from the interface between chips or chip packages due to electrical, signal integrity, or mechanical reasons. For example, in some embodiments, microelectronic package 400 may be a multi-chip microelectronic package with a package-in-package (PiP) configuration or a package-on-package (PoP) configuration.

Figure 7:
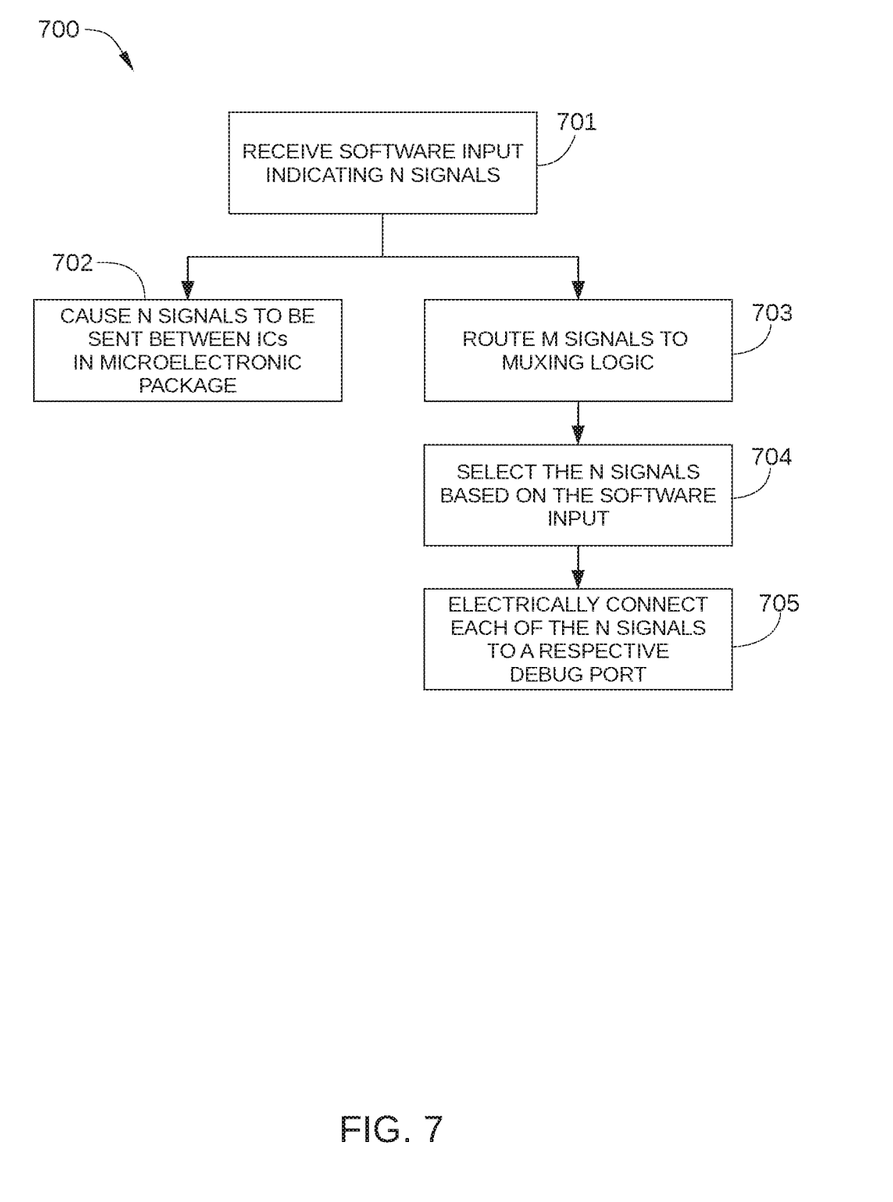
FIG. 7 is a flowchart of method steps for testing connections between IC chip within a microelectronic package, according to various embodiments of the present invention.

FIG. 7 is a flowchart of method steps for testing connections between IC chips within a microelectronic package, according to various embodiments of the present invention.

Although the method steps are described in conjunction with the systems of FIGS. 1-6, persons skilled in the art will understand that any system configured to perform the method steps, in any order, is within the scope of the present invention.

As shown, a method 700 begins at step 701, where IC chip 410 receives a software input, such as software input 503, indicating N signals that are transmitted between IC chip 410 and 3D IC stack 420.

In step 702, IC chip 410, e.g., via one or more software processes executing on IC chip 410, causes the N signals to be sent between IC chip 410 and 3D IC stack 420, such as data signals, commands, an IEEE 1500 instruction, etc. The N signals are typically sent as part of the operation of microelectronic package 400, and are included in the up to M signals that are sent between IC chip 410 and 3D IC stack 420 as part of the operation of microelectronic package 400.

In step 703, IC chip 410 routes the M signals to muxing logic 510, where the M signals are the signals that are transmitted via conductive traces 435A-435M. Some of the M signals may be transmitted from 3D IC stack 420 to IC chip 410, and some of the M signals may be transmitted from IC chip 410 to 3D IC stack 420. In some embodiments, the M signals are routed to muxing logic 510 via a conductive trace in IC chip 410 (i.e., one of conductive traces 521A-521M) that connects an output of a respective memory transmitter (i.e., one of memory transmitters 520A-520M) to an input of a respective memory receiver (i.e., one of host/GPU receivers 530A-530M). In such embodiments, each of the M signals is coupled to muxing logic 510 via a respective selectable logic device (i.e., one of selectable logic devices 533A-533M). In such embodiments, selectable logic devices 533A-533M are configured to couple the respective memory receiver to the muxing logic 510 in response to debug bus enable signal 534.

In step 704, IC chip 410, via muxing logic 510, selects the N signals based on software input 503.

In step 705, muxing logic 510 of IC chip 410 electrically connects each of the N signals to one of debug ports 441A-441N, respectively. As a result, the N signals can be monitored during operation of microelectronic package 400, even though the N signals are transmitted between IC chips via conductive traces that are normally inaccessible.

In sum, embodiments of the present invention provide a microelectronic package with an IC chip that includes logical circuitry for routing certain I/O signals to debug ports disposed on an outer surface of the microelectronic package. The I/O signals include data and command signals that are transmitted between semiconductor chips in the microelectronic package via conductive traces that are not physically accessible via with conventional debugging techniques. In some embodiments, the logical circuitry is configured to programmably select I/O signals based on a software input, and is connected to the various I/O signals transmitted between the IC chip and another IC chip in the microelectronic package when a debugging of the I/O signals is enabled. In such embodiments, circuitry employed in conventional operation of the IC chip may also be employed to connect the logical circuitry to the various I/O signals.

At least one advantage of the disclosed embodiments is that I/O signals sent between two semiconductor chips in a multi-chip package can be accessed and employed in troubleshooting the operation of the multi-chip package. A further advantage is that the plurality (e.g., thousands) of conductive traces carrying I/O signals between the two semiconductor chips can be selectively accessed via a manageable number of debug ports.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention has been described above with reference to specific embodiments. Persons of ordinary skill in the art, however, will understand that various modifications and changes may be made thereto without departing from the broader spirit and scope of the invention as set forth in the appended claims. For example, and without limitation, although many of the descriptions herein refer to specific types of application data, content servers, and client devices, persons skilled in the art will appreciate that the systems and techniques described herein are applicable to other types of application data, content servers, and client devices. The foregoing description and drawings are, accordingly, to be regarded in an illustrative rather than a restrictive sense.

While the preceding is directed to embodiments of the present disclosure, other and further embodiments of the disclosure may be devised without departing from the basic scope thereof, and the scope thereof is determined by the claims that follow.

What is claimed is:

1. A microelectronic package, comprising:
    a plurality of debug ports formed on an outer surface of the microelectronic package;
    a first semiconductor chip that is coupled to a semiconductor interposer and includes:
        a first plurality of electrical contacts, wherein each electrical contact included in the first plurality of electrical contacts is electrically coupled to a respective electrically conductive trace formed within the semiconductor interposer, and
        logical circuitry that selects a set of electrical contacts from the plurality of electrical contacts and electrically couples each electrical contact in the set of electrical contacts to a respective debug port in the plurality of debug ports; and
    a second semiconductor chip that is coupled to the semiconductor interposer and includes a second plurality of electrical contacts, wherein each electrical contact included in the second plurality of electrical contacts is electrically coupled to one of the electrically conductive traces formed within the semiconductor interposer.

2. The microelectronic package of claim 1, further comprising a third semiconductor chip that is disposed on the second semiconductor chip such that the second semiconductor chip resides between the semiconductor interposer and the third semiconductor chip.

3. The microelectronic package of claim 2, wherein the third semiconductor chip includes a third plurality of electrical contacts, wherein each electrical contact in the third plurality of electrical contacts is electrically coupled to the first semiconductor chip via one of the electrically conductive traces formed within the semiconductor interposer.

4. The microelectronic package of claim 3, wherein the logical circuitry is configured to electrically couple at least one electrical contact included in the third plurality of electrical contacts to a debug port included in the plurality of debug ports.

5. The microelectronic package of claim 1, wherein the plurality of debug ports includes a subset of N debug ports, and the logical circuitry selects a set of N electrical contacts from the second plurality of electrical contacts and electrically couples each electrical contact in the set of N electrical contacts to a respective debug port included in the subset of N debug ports, wherein N is a positive integer.

6. The microelectronic package of claim 1, wherein the logical circuitry is programmable to select the set of electrical contacts from the plurality of electrical contacts based on a software input.

7. The microelectronic package of claim 1, wherein the logical circuitry electrically couples at least one electrical contact included in the second plurality of electrical contacts to a debug port included in the plurality of debug ports.

8. The microelectronic package of claim 1, wherein the logical circuitry selects the set of electrical contacts from the first plurality of electrical contacts in response to a debug bus enable signal.

9. The microelectronic package of claim 1, wherein at least one debug port included in the plurality of debug ports is formed on a surface of a printed circuit board coupled to the microelectronic package.

10. The microelectronic package of claim 1, wherein at least one debug port included in the plurality of debug ports is formed on a surface of a package substrate that is coupled to the interposer.

11. The microelectronic package of claim 1, wherein each electrical contact included in the first plurality of electrical contacts is electrically coupled to a respective conductive trace in the first semiconductor chip that connects an output of a respective transmitter in the first semiconductor chip to an input of a respective receiver in the second semiconductor chip, and wherein the respective receiver is coupled to the logical circuitry.

12. The microelectronic package of claim 11, wherein each respective receiver is coupled to the logical circuitry via a respective selectable logic device.

13. The microelectronic package of claim 12, wherein the respective selectable logic device couples the respective receiver to the logical circuitry in response to a debug bus enable signal.

14. The microelectronic package of claim 1, wherein each electrical contact included in the second plurality of electrical contacts is electrically coupled to a respective conductive trace in the first semiconductor chip that connects to an input of a respective receiver in the first semiconductor chip, and wherein the respective receiver is coupled to the logical circuitry.

15. A microelectronic package, comprising:
    a plurality of debug ports formed on an outer surface of the microelectronic package;
    a first semiconductor chip that is coupled to a semiconductor interposer and includes:
        a first plurality of electrical contacts, wherein each electrical contact is electrically coupled to a respective electrically conductive trace formed within the semiconductor interposer, and
        logical circuitry configured to select a set of electrical contacts from the plurality of electrical contacts and to electrically couple each electrical contact in the set of electrical contacts to a respective debug port in the plurality of debug ports; and a second semiconductor chip that is coupled to the semiconductor interposer and includes a second plurality of electrical contacts, wherein each electrical contact in the second plurality of electrical contacts is electrically coupled to a conductive trace of the first semiconductor chip, wherein the conductive trace of the first semiconductor chip connects an output of a transmitter included in the first semiconductor chip to an input of a receiver that also is included in the first semiconductor chip and is coupled to the logical circuitry, and wherein the transmitter is configured to transmit a signal to the second semiconductor chip, and the receiver is configured to receive a signal from the second semiconductor chip.

* * * * *

UNITED STATES PATENT AND TRADEMARK OFFICE
CERTIFICATE OF CORRECTION

PATENT NO. : 10,317,459 B2
APPLICATION NO. : 15/582539
DATED : June 11, 2019
INVENTOR(S) : Ish Chadha et al.

Page 1 of 1

It is certified that error appears in the above-identified patent and that said Letters Patent is hereby corrected as shown below:

On the Title Page

Item (56) References Cited:
Please delete "Jingee, "HBM Controller IP Holds the Key to Bandwidth", http://www.open-silicon.com/hbm-controller-ip-holds-key-bandwidth/, Jul. 1, 2016, 4 pages." and insert --Dingee, "HBM Controller IP Holds the Key to Bandwidth", http://www.open-silicon.com/hbm-controller-ip-holds-key-bandwidth/, Jul. 1, 2016, 4 pages.--.

Signed and Sealed this
Third Day of September, 2019

Andrei Iancu
*Director of the United States Patent and Trademark Office*